United States Patent [19]
Koyama et al.

[11] Patent Number: 5,981,366
[45] Date of Patent: Nov. 9, 1999

[54] METHOD FOR MANUFACTURING NON-VOLATILE MEMORY

[75] Inventors: Yasuhiro Koyama, Yamatokooriyama; Hiroshi Ishihara, Tenri, both of Japan

[73] Assignee: Sharp Kabushiki Kaisha, Osaka, Japan

[21] Appl. No.: 07/945,902

[22] Filed: Sep. 17, 1992

[30] Foreign Application Priority Data

Sep. 19, 1991 [JP] Japan ................................ 3-239970

[51] Int. Cl.$^6$ .......................... H01L 21/44; C23C 16/42
[52] U.S. Cl. ................. 438/593; 438/594; 427/255.17; 427/255.27; 427/255.392
[58] Field of Search ............................ 427/248.1, 255, 427/255.1, 126.1; 437/193, 195, 200, 192, 43; 438/592, 593, 594

[56] References Cited

U.S. PATENT DOCUMENTS

| | | | |
|---|---|---|---|
| 4,692,343 | 9/1987 | Price et al. | 427/578 |
| 4,737,474 | 4/1988 | Price et al. | |
| 4,816,425 | 3/1989 | McPherson | 438/592 |
| 4,897,368 | 1/1990 | Kobushi et al. | 437/200 |
| 4,966,869 | 10/1990 | Hillman et al. | 437/200 |
| 5,087,584 | 2/1992 | Wada et al. | 437/43 |
| 5,120,571 | 6/1992 | Gill et al. | 437/51 |
| 5,120,673 | 6/1992 | Itoh | 437/43 |
| 5,156,990 | 10/1992 | Mitchell | 437/43 |
| 5,188,976 | 2/1993 | Kume et al. | 437/195 |
| 5,190,887 | 3/1993 | Tang et al. | 437/43 |
| 5,290,725 | 3/1994 | Tanaka et al. | 438/593 |

OTHER PUBLICATIONS

"Tungsten Silicide Films Deposited by $SiH_2Cl_2$–$WF_6$ Chemical Reaction," T. Hara et al, *J. Electrochem. Soc.*, vol. 136, No. 4, Apr. 1989 (pp. 1177–1180).

"Properties of $WSi_x$ Using Dichlorosilane in a Single–Wafer System," T. H. Tom et al, *J. Vac. Sci. Technol. B.*, Nov./Dec. 1988 (pp. 1707–1713).

"Properties of Chemical Vapor Deposited Tungsten Silicide Films Using Reaction of $WF_6$ and $Si_2H_6$," Y. Shioya et al, *J. Electrochem. Soc: Solid–State Science and Technology*, May 1987 (pp. 1220–1224).

*Primary Examiner*—Shrive Beck
*Assistant Examiner*—Bret B. Chen
*Attorney, Agent, or Firm*—Nixon & Vanderhye P.C.

[57] ABSTRACT

A method for forming a non-volatile memory having a floating gate electrode arranged therein. The floating gate electrode being formed by alternatingly laminating on a silicon substrate a polysilicon layer and a tungsten silicide layer with a tunnel oxide sandwiched between said substrate and said polysilicon layer. The tungsten silicide layer is formed with a CVD technique reducing $WF_6$ gas with $SiH_2Cl_2$ gas.

4 Claims, 2 Drawing Sheets

METHOD FOR MANUFACTURING NON-VOLATILE MEMORY

BACKGROUND OF THE INVENTION

1. Field of the Invention

This invention relates to a method for forming a non-volatile memory, and more particularly to a method for forming a floating gate electrode.

2. Description of the Prior Art

Conventionally known is a non-volatile memory having a floating gate electrode arranged therein, said floating gate electrode being formed by laminating on a silicon substrate either a polysilicon layer or by alternatingly laminating a polysilicon layer and a tungsten silicide layer with a tunnel oxide sandwiched between said substrate and said polysilicon layer.

As a method for forming a floating gate electrode formed by laminating a polysilicon layer or by alternatingly laminating a polysilicon and a tungsten silicide layer with a tunnel oxide sandwiched between said substrate and said polysilicon layer, known is a method wherein a tungsten silicide layer is laminated on a polysilicon layer with a CVD technique of reducing $WF_6$ gas with $SiH_4$ gas at 300° C. to 400° C. under reduced pressure.

In a conventional method for forming a floating gate electrode formed by alternatingly laminating a polysilicon layer and a tungsten silicide layer, the laminated electrode has approximately 1/10 of the specific resistance compared to a floating gate electrode formed of only a polysilicon layer. Thus the laminated floating gate electrode is favorably used in devices that require a high response speed compared to the response speed of devices having floating gate electrodes formed of only a polysilicon layer. However, even such a laminated floating gate electrode formed by alternatingly laminating a polysilicon layer and a tungsten silicide layer is liable to tear at the tunnel oxide because of to the operation of rewriting memory contents.

SUMMARY OF THE INVENTION

It is an object of the invention to overcome the above drawback. This invention provides a method for forming a non-volatile memory small in specific resistance and high in response speed while prolonging the life-span of the tunnel oxide to the degree almost identical to that of the polysilicon layer while minimizing the fragility in the operation of rewriting memory contents.

This invention provides a method for forming a non-volatile memory having a floating gate electrode arranged therein. The floating gate electrode being formed by alternatingly laminating on a silicon substrate a polysilicon layer and a tungsten silicide layer with a tunnel oxide sandwiched between the substrate and a polysilicon layer, wherein the tungsten silicide layer is formed with a chemical vapour deposition (CVD) technique reducing $WF_6$ gas with $SiH_2Cl_2$ gas.

BRIEF DESCRIPTION OF THE DRAWINGS

A preferred form of the invention is illustrated in the accompanying drawings in which.

DESCRIPTION OF THE PREFERRED EMBODIMENT

Figure 1:
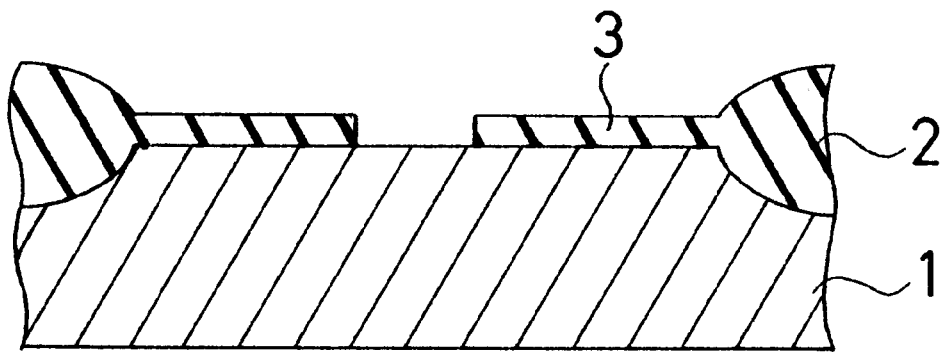
FIG. 1 shows a view illustrating a process for forming a non-volatile memory device formed in an embodiment of the present invention.

According to this invention, a floating gate electrode is arranged in the non-volatile memory, the electrode is formed by alternatingly laminating on a silicon substrate a polysilicon layer and a tungsten silicide layer with a tunnel oxide sandwiched between the substrate and polysilicon layer.

The purpose of providing a tunnel oxide is two-fold; One is to transfer electric charge with a tunnel effect between the source/drain and the floating gate electrode when a high voltage is applied for writing in and rewriting the memory content. The other is to insulate the floating gate electrode when a high voltage is not applied. A 60 to 120 Å thick silicon oxide is usually provided for forming the tunnel oxide.

The floating gate electrode is provided for accepting and discharging electric charges through the tunnel oxide in accordance with the memory content to either write in or call at a high response speed the memory content. The specific resistance of the floating gate electrode is preferably small. It is formed by alternatingly laminating on a tunnel oxide a polysilicon layer and a tungsten silicide layer. Either a $N^+$ or $P^+$ impurity-doped layer may be formed on the tunnel insulating film surface in the actual usage of the polysilicon layer. The thickness of the polysilicon layer is usually 0.1 $\mu$m to 0.3 $\mu$m.

The tungsten silicide layer is provided for reducing the specific resistance of the floating gate electrode. It is laminated on the polysilicon layer to form together a floating gate electrode.

The tungsten silicide layer is formed in the following manner. A silicon substrate whose surface is coated with a polysilicon layer with a tunnel oxide sandwiched therebetween is arranged in a CVD apparatus. It is heated to a predetermined temperature, followed by supplying a predetermined amount of $WF_6$ gas and $SiH_2Cl_2$ gas to reduce $WF_6$ gas with $SiH_2Cl_2$ gas for laminating a predetermined amount of tungsten silicide layer to a predetermined thickness.

The predetermined temperature in the above process is usually 450 to 650° C., or preferably 500 to 600° C. In supplying gas to the CVD device, the flow rate of $WF_6$ gas is usually determined to be 1 to 5 sccm while $SiH_2Cl_2$ gas is usually 100 to 200 sccm. Supplying $WF_6$ gas and $SiH_2Cl_2$ gas usually provides the pressure of 0.01 to 1 Torr, or preferably 0.07 to 0.1 Torr in the CVD device. $WF_6$ gas in the amount preferably corresponding to the partial pressure of 0.001 to 0.003 Torr is reduced with $SiH_2Cl_2$ gas in the amount preferably corresponding to the partial pressure of 0.07 to 0.1 Torr. The tungsten silicide layer thus obtained usually contains approximately $1\times10^{19}$ atoms/cm$^3$ of fluorine. Preferably the amount is $1\times10^{20}$ atoms/cm$^3$ or less. Besides the thickness of the tungsten silicide layer is preferably 0.1 to 0.3 $\mu$m.

In this invention, a laminated region of the tungsten silicide layer and the polysilicon layer are etched into a predetermined patterns. The etched surface is coated with an insulating layer to form a floating gate electrode. Subsequently, a source/drain and a metal electrode are formed to form a non-volatile memory in the same manner with the method of forming known EEPROMs.

This invention is described in further detail by way of example with respect to the drawings.

Embodiment

Referring initially to FIG. 1, on a silicon substrate 1, a field oxide film 2 is formed to isolate device regions. After forming an ion implantation layer in the silicon substrate below a tunnel oxide formation region within the memory cell, a gate oxide is formed in the thickness of approximately 200 Å in this device region.

Following this process, a window is formed with a photolithographic technique in a tunnel oxide formation region.

Figure 2:
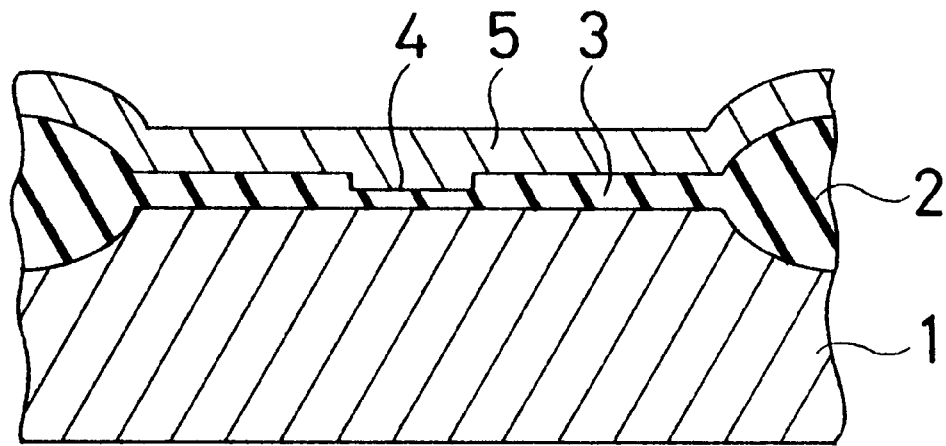
FIG. 2 shows a view illustrating a process for forming a non-volatile memory device formed in the embodiment.

As shown in FIG. 2, an approximately 80 Å thick tunnel oxide 4 is formed to deposit thereon an approximately 0.15 μm thick (thickness above the gate oxide 3) phosphorus-doped polysilicon layer.

Figure 3:
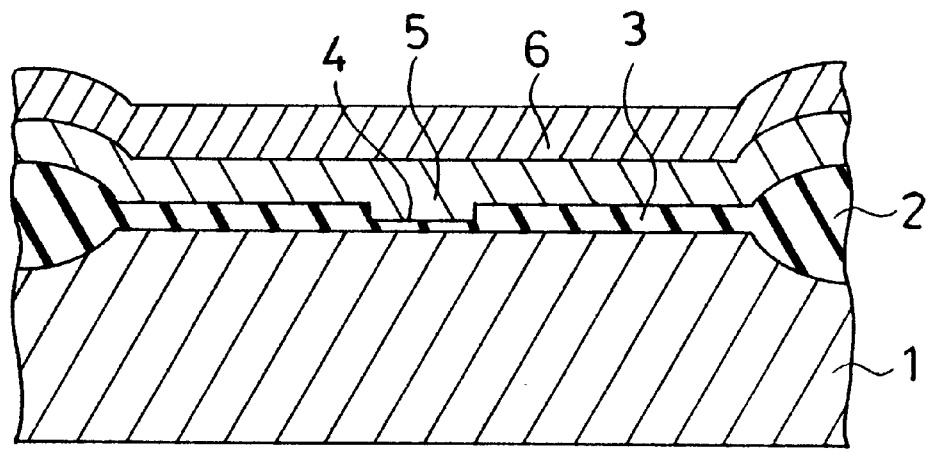
FIG. 3 shows a view illustrating a process for forming a non-volatile memory device formed in the embodiment.

As shown in FIG. 3, approximately 0.2 μm thick tungsten silicide layer 6 is formed at 500 to 600° C. with a LPCVD technique using both $SiH_2Cl_2$ and $WF_6$ gas. However the amount of $SiH_2Cl_2$ gas and $WF_6$ gas to be supplied in the CVD device is respectively 100 to 200 sccm and 1 to 5 sccm. The CVD device is applied with the pressure (reaction pressure) of 0.07 Torr to 0.1 Torr.

Figure 4:
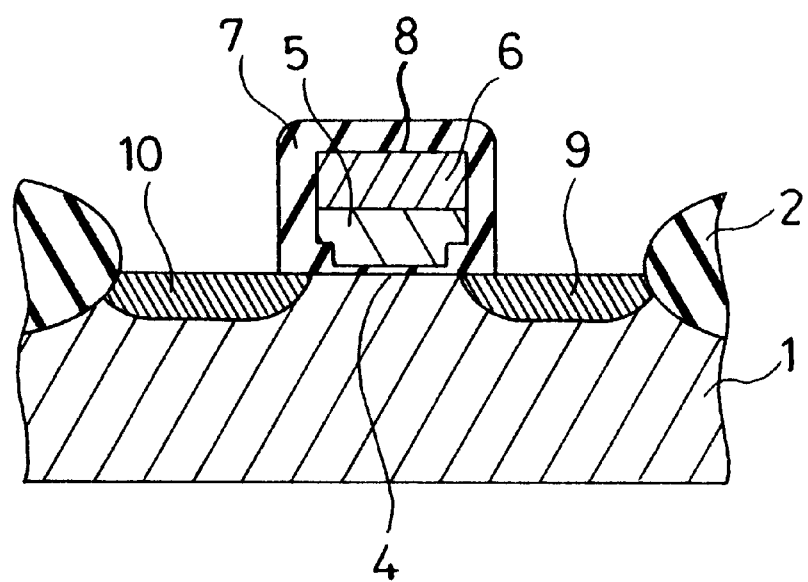
FIG. 4 shows a view illustrating a process for forming a non-volatile memory device formed in the embodiment.

In the next process, as shown in FIG. 4, a tungsten silicide layer 6 and a polysilicon layer 5 are etched into a predetermined pattern. On the surface, silicon oxide layer is formed to provide a floating gate electrode 8. Later, a source 9, a drain 10 and a metal electrode is provided to form a non-volatile device in a manner similar to those used in conventional techniques of forming EEPROMs.

Comparison 1

Unlike Embodiment 1, in Comparison 1 a phosphorus-doped polysilicon layer is formed with a thickness of 0.15 μm. On the surface, a floating gate electrode is formed only with the polysilicon layer without forming a tungsten silicide layer. Thus, a non-volatile DRAM is formed in the same manner with Embodiment 1 except for the above point.

Comparison 2

Unlike Embodiment 1, in Comparison 2 $SiH_4$ gas is used in the place of $SiH_2Cl_2$ to form a tungsten silicide layer with a liquid phase chemical vapour deposition (LPCVD) technique at 300 to 400° C. Thus, a non-volatile memory is formed in the same manner with Embodiment 1 except for this point.

The average time of the tunnel oxide breakdown in Example 1, Comparison 1 and Comparison 2 is determined by measuring the fluorine content and the specific resistance of the floating gate electrode and by measuring the time dependent dielectric breakdown (TDDB) of constant current.

TABLE 1

| Embodiment and Comparison | Tunnel Oxide Average Breakdown Time * | Floating Gate Electrode Fluorine Content (atoms/cm³) | Floating Gate Electrode Specific Resistance (μΩ · cm) |
| --- | --- | --- | --- |
| E 1 | 80 | $1 \times 10^{19}$ | 100 |
| C 1 | 100 | 0 | 1000 |
| C 2 | 15 | $1 \times 10^{21}$ | 100 |

* Comparison 1 is determined to be 100.

As is shown in Table 1, it is proven that the non-volatile memory obtained in the embodiment of the invention has a floating gate electrode with a small specific resistance free from a large decrease in the average breakdown time of the tunnel oxide.

Operation $SiH_2Cl_2$ reduces $WF_6$ gas to form a tungsten silicide layer containing only a minimal amount of fluorine as an impurity. The tungsten silicide layer containing only a minimal amount of fluorine inhibits the breakage of the tunnel oxide due to the operation of rewriting the memory content.

Effect of the Invention

This invention provides a process for forming a non-volatile memory provided with a floating gate electrode small in specific resistance and high in response speed without shrinking the life-span of the tunnel oxide owing to the operation of rewriting the memory content.

What is claimed is:

1. A method for forming a non-volatile memory having a floating gate electrode comprising the steps of:

a) forming a tunnel oxide layer used for writing information on a silicon substrate, b) forming a polysilicon layer on the tunnel oxide layer, c) forming a tungsten silicide layer over the polysilicon layer with a chemical vapor deposition using $WF_6$ gas reduced with a $SiH_2Cl_2$ gas at a temperature in the range of 500 to 600° C., the $SiH_2Cl_2$ gas having a flow rate at least two orders of magnitude greater than a flow rate of the $WF_6$ gas, and the fluorine content in the resulting tungsten silicide layer being $1 \times 10^{20}$ atom/cm³ or less, and d) patterning the polysilicon layer and the tungsten silicide layer by etching to make a floating gate.

2. A method of claim 1 wherein $WF_6$ gas of 0.001 to 0.003 Torr is reduced with $SiH_2Cl_2$ gas of 0.07 to 0.1 Torr.

3. A method of claim 1 wherein said tungsten silicide layer has a film thickness of 0.1 to 0.3 μm.

4. A method of claim 1 wherein said tunnel oxide layer is formed of a silicon oxide.

* * * * *